(12) United States Patent
Nakaiso

(10) Patent No.: US 10,388,603 B2
(45) Date of Patent: Aug. 20, 2019

(54) THIN FILM ELEMENT AND METHOD FOR MANUFACTURING THE SAME

(71) Applicant: Murata Manufacturing Co., Ltd., Nagaokakyo-shi, Kyoto-fu (JP)

(72) Inventor: Toshiyuki Nakaiso, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 15/941,237

(22) Filed: Mar. 30, 2018

(65) Prior Publication Data

US 2018/0226346 A1 Aug. 9, 2018

Related U.S. Application Data

(63) Continuation of application No. PCT/JP2016/080467, filed on Oct. 14, 2016.

(30) Foreign Application Priority Data

Oct. 30, 2015 (JP) .................................. 2015-214182

(51) Int. Cl.
*H01L 23/00* (2006.01)
*H01L 23/528* (2006.01)
(Continued)

(52) U.S. Cl.
CPC ......... *H01L 23/5283* (2013.01); *H01G 4/008* (2013.01); *H01G 4/228* (2013.01);
(Continued)

(58) Field of Classification Search
CPC ............. H01L 23/5283; H01L 21/0274; H01L 21/2885; H01L 21/7685; H01L 21/76895;
(Continued)

(56) References Cited

U.S. PATENT DOCUMENTS 6,426,556 B1 * 7/2002 Lin .................... H01L 24/03
257/738
8,030,767 B2 * 10/2011 Yang ................... H01L 24/03
257/737

(Continued)

FOREIGN PATENT DOCUMENTS

JP 2003-124389 A 4/2003
JP 2009-231682 A 10/2009
(Continued)

OTHER PUBLICATIONS

JP 2010-267641A English Translation; published on Nov. 25, 2010 (Year: 2010).*

(Continued)

*Primary Examiner* — Pete T Lee
(74) *Attorney, Agent, or Firm* — Arent Fox LLP

(57) ABSTRACT

A thin film element that includes a base material, a wiring conductor film disposed on the surface of the base material, a protective film that covers the surface of at least the wiring conductor film, an outer electrode, and a first resist film and a second resist film that cover the surface of the protective film. The protective film has a contact hole at a location overlapping the wiring conductor film. The outer electrode is disposed in the contact hole and on the surface of the wiring conductor film. The outer electrode is thicker than the protective film and has a side surface. The first resist film is in contact with the entire circumference of the side surface of the outer electrode, and the second resist film is disposed at a distance from the side surface of the outer electrode and the first resist film.

18 Claims, 5 Drawing Sheets

(51) Int. Cl.

| | | |
|---|---|---|
| *H01L 29/45* | (2006.01) | |
| *H01L 21/768* | (2006.01) | |
| *H01L 21/027* | (2006.01) | |
| *H01L 21/288* | (2006.01) | |
| *H01G 4/008* | (2006.01) | |
| *H01G 4/33* | (2006.01) | |
| *H01L 27/01* | (2006.01) | |
| *H01G 4/228* | (2006.01) | |
| *H01L 23/532* | (2006.01) | |
| *H03H 7/01* | (2006.01) | |
| *H03H 3/00* | (2006.01) | |
| *H01L 27/02* | (2006.01) | |

(52) U.S. Cl.
CPC ............ *H01G 4/33* (2013.01); *H01L 21/0274* (2013.01); *H01L 21/2885* (2013.01); *H01L 21/7685* (2013.01); *H01L 21/76895* (2013.01); *H01L 23/53238* (2013.01); *H01L 24/03* (2013.01); *H01L 24/05* (2013.01); *H01L 24/11* (2013.01); *H01L 27/016* (2013.01); *H01L 29/45* (2013.01); *H01L 27/0248* (2013.01); *H01L 2224/03849* (2013.01); *H01L 2224/0401* (2013.01); *H01L 2224/05082* (2013.01); *H01L 2224/05147* (2013.01); *H01L 2224/05155* (2013.01); *H01L 2224/05573* (2013.01); *H01L 2224/05644* (2013.01); *H01L 2224/11849* (2013.01); *H01L 2224/13021* (2013.01); *H03H 3/00* (2013.01); *H03H 7/0115* (2013.01)

(58) Field of Classification Search
CPC ... H01L 23/53238; H01L 24/03; H01L 24/05; H01L 24/11; H01L 27/016; H01L 29/45; H01L 27/0248; H01L 2224/03849; H01L 2224/0401; H01L 2224/05082; H01L 2224/05147; H01L 2224/05155; H01L 2224/05573; H01L 2224/05644; H01L 2224/11849; H01L 2224/13021; H01G 4/008; H01G 4/228; H01G 4/33; H03H 3/00; H03H 7/011

See application file for complete search history.

(56) References Cited

U.S. PATENT DOCUMENTS

| | | | | |
|---|---|---|---|---|
| 8,598,030 | B2* | 12/2013 | Kuo | ............... H01L 24/11 |
| | | | | 438/614 |
| 2015/0262846 | A1* | 9/2015 | Lee | ............... H01L 21/563 |
| | | | | 257/737 |

FOREIGN PATENT DOCUMENTS

| | | |
|---|---|---|
| JP | 2009-266803 A | 11/2009 |
| JP | 2010-267641 A | 11/2010 |
| JP | 2012-74487 A | 4/2012 |
| JP | 2013-98507 A | 5/2013 |
| JP | 2014-195830 A | 10/2014 |

OTHER PUBLICATIONS

International Search Report issued for PCT/JP2016/080467, dated Jan. 10, 2017.
Written Opinion of the International Searching Authority issued for PCT/JP2016/080467, dated Jan. 10, 2017.

* cited by examiner

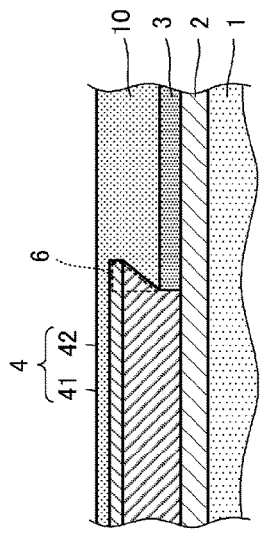
FIG. 5(1)
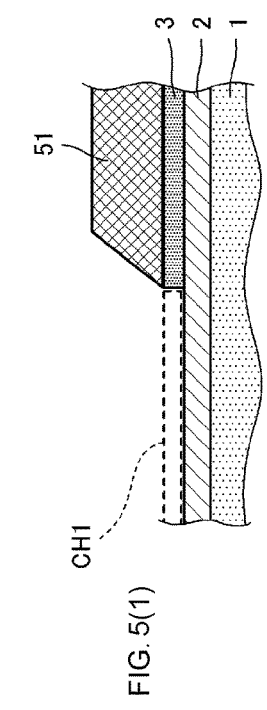
FIG. 5(2)
FIG. 5(3)
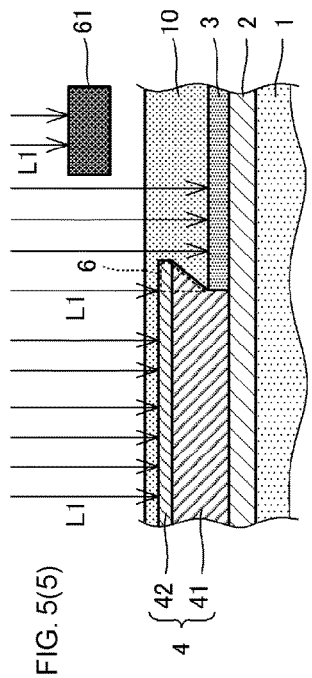
FIG. 5(4)
FIG. 5(5)
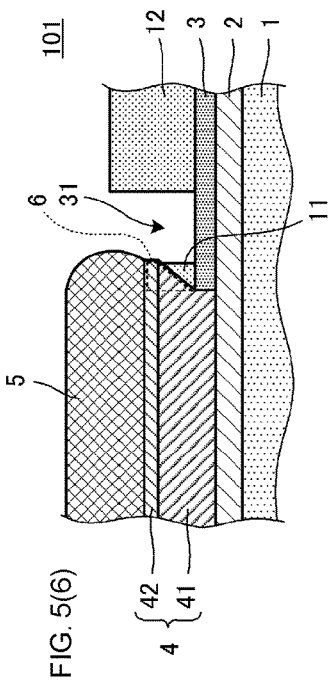
FIG. 5(6)

THIN FILM ELEMENT AND METHOD FOR MANUFACTURING THE SAME

CROSS REFERENCE TO RELATED APPLICATIONS

The present application is a continuation of International application No. PCT/JP2016/080467, filed Oct. 14, 2016, which claims priority to Japanese Patent Application No. 2015-214182, filed Oct. 30, 2015, the entire contents of each of which are incorporated herein by reference.

FIELD OF THE INVENTION

The present invention relates to a thin film element and, in particular, to a thin film including, for example, a base material, a wiring conductor film disposed on the base material, and an outer electrode disposed on the wiring conductor film. Also, the present invention relates to a method for manufacturing the thin film element.

BACKGROUND OF THE INVENTION

To date, a terminal structure including a base material, a wiring conductor film disposed on the base material, an outer electrode disposed on the surface of the wiring conductor film, a resist film with which the surface of the base material and the surface of the wiring conductor film are covered, and a solder bump disposed on the surface of the outer electrode (Patent Document 1).

In this regard, as disclosed in Patent Document 1, when a conductive bonding material, e.g., solder, is bonded to the outer electrode, a method (over resist treatment), in which the outer edge of the wiring conductor film or the outer electrode is covered with a resist film, is adopted in general for the purpose of preventing the wiring conductor film or the outer electrode, which is formed on the base material, from peeling off the base material.

However, Au which constitutes the outer electrode gets wet with solder easily, and when the solder is bonded to the outer electrode, there is a concern that the solder may infiltrate into the interface between the surface of the outer electrode and the resist layer and the surface of the outer electrode may serve as a start point of peeling of the resist layer subjected to the over resist treatment.

Meanwhile, there is also a clearance resist type terminal structure in which a predetermined clearance is located between the resist layer and the outer electrode for the purpose of suppressing such peeling of the resist film (Patent Document 2).

Patent Document 1: Japanese Unexamined Patent Application Publication No. 2012-74487

Patent Document 2: Japanese Unexamined Patent Application Publication No. 2013-98507

SUMMARY OF THE INVENTION

However, when a predetermined clearance is located between the resist layer and the outer electrode, there is a concern that the solder may infiltrate into the clearance and the wiring conductor film exposed at the clearance may react with the solder (solder leaching or the like) so as to cause an increase in resistance value and breaking of wire in the wiring conductor film. In addition, there is a concern that moisture, flux, or the like may infiltrate into the clearance and the wiring conductor film exposed at the clearance may be corroded.

An object of the present invention is to provide a thin film element including an outer electrode with high reliability while solder leaching, corrosion, and the like of a wiring conductor film are suppressed in a structure in which a resist layer is disposed at a distance from an outer electrode and to provide a method for manufacturing the thin film element.

The thin film element according to an aspect of the present invention includes a base material, a wiring conductor film disposed on the surface of the base material, a protective film covering the surface of at least the wiring conductor film and having a contact hole at a location overlapping the wiring conductor film in a plan view of the thin film element, an outer electrode extending within the contact hole and onto the wiring conductor film, the outer electrode being thicker than the protective film and having a side surface with an overhang portion that extends along an entire circumference of the side surface, a first resist film in contact with the entire circumference of the side surface of the outer electrode and the protective film, and overlapping the overhang portion in the plan view of the film element, and a second resist film disposed at a distance from the side surface of the outer electrode and the first resist film and covering a surface of the protective film.

In this configuration, the wiring conductor film is not exposed at a clearance located between the side surface of the outer electrode and the first resist film and between the side surface of the outer electrode and the second resist film. As a result, even if a conductive bonding material, moisture, flux, or the like infiltrates into the clearance, a reaction between the wiring conductor film and the conductive bonding material 5 and the like are suppressed.

In addition, in this configuration, since the first resist film in contact with the entire circumference of the side surface of the outer electrode, infiltration of a conductive bonding material, moisture, flux, or the like into the interface between the side surface of the outer electrode and the protective film is suppressed.

The first resist film is preferably a thermosetting resin. According to this configuration, the first resist film shrinks when being cured, and a stress occurs in the cured loop-shaped first resist film so as to cause tightening inward. Therefore, the side surface of the outer electrode is tightened by the first resist film, with which the surface of the protective film is covered, and infiltration of a conductive bonding material, moisture, flux, or the like into the interface between the side surface of the outer electrode and the protective film is suppressed.

In addition, according to this configuration, stress that directs outward from the outer electrode occurs in the cured second resist film. However, the occurrence of a gap between the outer electrode and the first resist film is further suppressed because the second resist film is disposed at a distance from the first resist film.

Preferably, the outer electrode has an overhang portion present along the entire circumference of the side surface, and the first resist film overlaps the overhang portion in plan view. According to this configuration, movement of the cured loop-shaped first resist film in a direction from the bottom surface of the outer electrode toward the top surface can be suppressed.

The outer electrode may also be formed such that the side surface has a reverse tapered shape in a direction from the bottom surface toward the top surface.

The wiring conductor film may also be a metal film containing copper as a primary component, the protective film may be a metal film containing titanium as a primary component, and the outer electrode may be a metal film containing nickel as a primary component.

A method for manufacturing a thin film element, according to an aspect of the present invention includes forming a wiring conductor film on the surface of a base material, covering the surface of at least the wiring conductor film with a protective film having a contact hole at a location overlapping the wiring conductor film, forming an outer electrode in the contact hole and on the surface of the wiring conductor film such that the outer electrode has a side surface with an overhang portion extending along the entire circumference of the side surface, covering the surface of the protective film with a resist film, and removing portions of the resist film so as to separate the resist film into a first resist film portion and a second resist film portion that are spaced apart from each other, the first resist film portion overlapping the overhang portion in a plan view of the film element.

According to this manufacturing method, a thin film element including an outer electrode with high reliability can be readily produced while solder leaching, corrosion, and the like of a wiring conductor film are suppressed.

Preferably, the portions of the resist film are removed by photolithography, the resist film is a positive type photosensitive resist film, and the overhang portion of the outer electrode is used as a photomask during the photolithography to form the first resist film portion. According to this manufacturing method, the first resist film in contact with the entire circumference of the side surface of the outer electrode can be readily formed.

The method also preferably includes a set of precoating the surface of the outer electrode with solder after removing the portions of the resist film.

According to the present invention, a thin film element including an outer electrode with high reliability can be realized while solder leaching, corrosion, and the like of a wiring conductor film are suppressed in a structure in which a predetermined clearance is located between a resist layer and the outer electrode.

BRIEF DESCRIPTION OF THE DRAWINGS

FIGS. 5(1) to 5(6) are sectional views sequentially showing production steps of the thin film element 101.

DETAILED DESCRIPTION OF THE PREFERRED EMBODIMENTS

Figure 1:
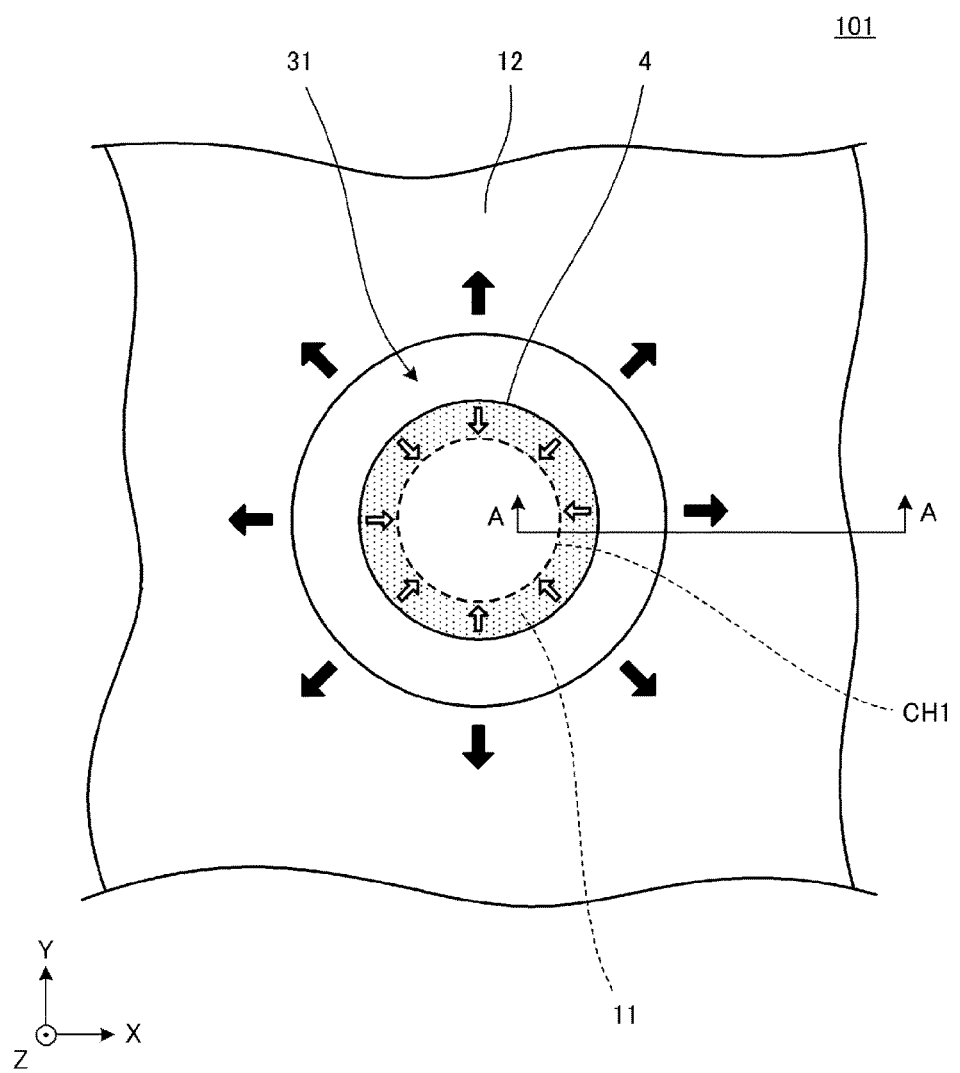
FIG. 1 is a detailed plan view showing the configuration of an outer electrode 4 of a thin film element 101 according to a first embodiment.

A plurality of embodiments for realizing the present invention will be described below with reference to drawings and some specific examples. In the drawings, the same portions are indicated by the same reference numerals. In consideration of importance of an explanation or ease of understanding, some embodiments are shown separately for the sake of convenience. However, configurations shown in different embodiments can be partly replaced or combined with each other. In the second and subsequent embodiments, descriptions of items common to the first embodiment will not be provided and only different points will be described. In particular, the same operations and advantages due to the same configuration will not be described in all embodiments.

First Embodiment

Figure 2:
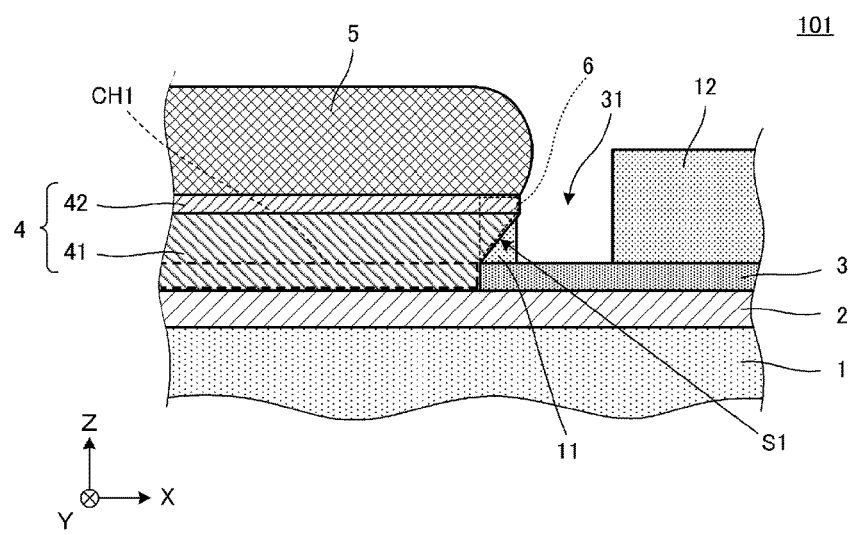
FIG. 2 is a sectional view along line A-A in FIG. 1.
Figure 3:
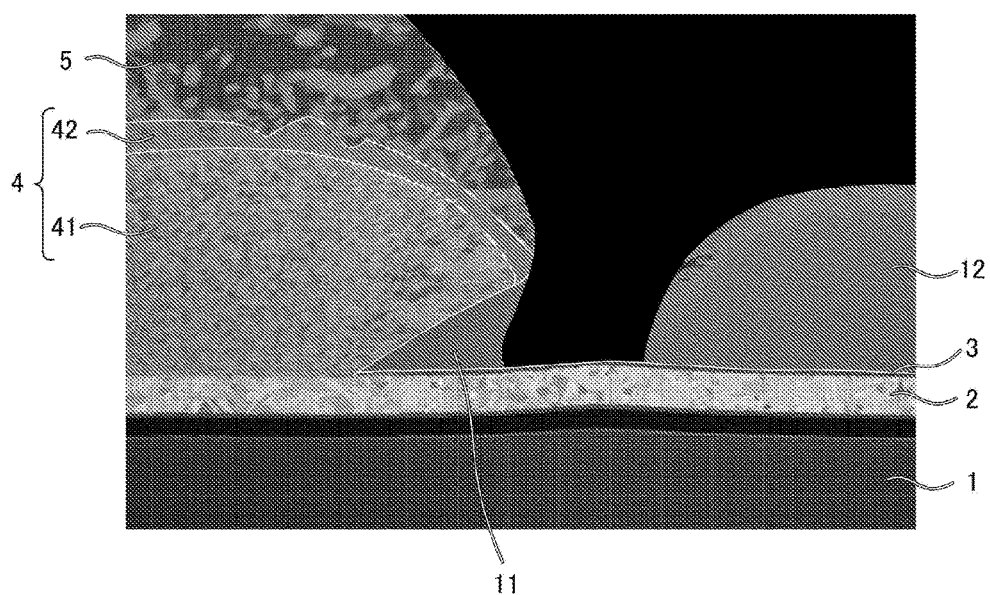
FIG. 3 is a sectional view showing an actual state of the outer electrode 4 of the thin film element 101.

FIG. 1 is a detailed plan view showing the configuration of an outer electrode 4 of a thin film element 101 according to a first embodiment. FIG. 2 is a sectional view along line A-A in FIG. 1. FIG. 3 is a sectional view showing an actual state of the outer electrode 4 of the thin film element 101. In FIG. 2, the thickness of each portion is exaggeratedly shown. The same applies to the sectional view in each embodiment described below. The thin film element 101 is, for example, a passive element, e.g., a capacitor, or a thin film device, e.g., an LC composite electronic component, a semiconductor integrated circuit element, or an ESD protective element.

The thin film element 101 includes a base material 1, a wiring conductor film 2, a protective film 3, an outer electrode 4, a conductive bonding material 5, a first resist film 11, and a second resist film 12.

The base material 1 is an insulating flat plate having a flat surface. The wiring conductor film 2 is disposed on the surface of the base material 1. The base material 1 is a base member so as to constitute, for example, a passive element, an LC composite electronic component, an integrated circuit element, an ESD protective element, or the like and is, for example, a Si substrate or a glass substrate. In this regard, other insulating layers or wiring conductor layers may be disposed between the base material 1 and the wiring conductor film 2.

The surface of the wiring conductor film 2 is covered with the protective film 3. As shown in FIG. 2, the protective film 3 has a contact hole CH1 at a location overlapping the wiring conductor film 2 when viewed in Z-direction (in plan view). That is, the protective film 3 has a contact hole CH1 that exposes the wiring conductor film 2 when viewed in Z-direction. The wiring conductor film 2 is, for example, a Cu film. The protective film 3 is, for example, a metal film containing Ti as a primary component.

The outer electrode 4 is a metal plating film having a circular shape in plan view and has a first electrode layer 41 and a second electrode layer 42. The first electrode layer 41 is disposed on the surface of the wiring conductor film 2, and the second electrode layer 42 is disposed on the surface of the first electrode layer 41. The outer electrode 4 is, for example, a metal plating film containing Ni as a primary component. The first electrode layer 41 is, for example, a Ni plating film, and the second electrode layer 42 is, for example, a Au plating film.

The outer electrode 4 is disposed on the surface of the wiring conductor film 2 exposed through the contact hole CH1. That is, the outer electrode 4 is disposed in the contact hole CH1 and on the surface of the wiring conductor film 2. As shown in FIG. 2, the outer electrode 4 is thicker than the protective film 3 and has a side surface S1. As shown in FIG. 2, the outer electrode 4 is formed such that the side surface S1 has a reverse tapered shape in a direction from the bottom surface toward the top surface thereof. Consequently, the outer electrode 4 has an overhang portion 6 that constitutes the side surface S1. The overhang portion 6 is present along the entire circumference of the side surface S1. In this regard, the "overhang portion" refers to the entirety of a portion that extends from the bottom surface (base) of the outer electrode 4 when viewed in Z-direction (in plan view).

The conductive bonding material 5 is disposed on the surface of the outer electrode 4. The conductive bonding material 5 is, for example, solder with which the surface of the outer electrode 4 is precoated. In this regard, the conductive bonding material 5 may be a solder ball temporarily fixed to the surface of the outer electrode 4 by a flux or the like.

The first resist film 11 is a thermosetting resin with which the surface of the protective film 3 is covered and is in contact with the entire circumference of the side surface S1 of the outer electrode 4. Consequently, the first resist film 11 according to the present embodiment has a shape of a loop (annular shape or ring shape where the shape may be partly cut) that covers the interface between the outer electrode 4 and the protective film 3. The entire first resist film 11 falls within the overhang portion 6 of the outer electrode 4 when viewed in Z-direction. Therefore, the first resist film 11 is covered with the outer electrode (overlapped by the outer electrode 4) when viewed in Z-direction. The first resist film 11 is, for example, a positive type photosensitive solder resist film.

The second resist film 12 is a thermosetting resin with which the surface of the protective film 3 is covered. The second resist film 12 is formed from the same resin as the first resist film 11 and is disposed at a distance from the side surface S1 of the outer electrode 4 and the first resist film 11. Therefore, as shown in FIG. 2 and the like, a clearance 31 is located between the side surface S1 of the outer electrode 4 and the second resist film 12 and between the first resist film 11 and the second resist film 12. The second resist film 12 is, for example, a positive type photosensitive solder resist film. The first resist film 11 and the second resist film 12 are produced by patterning the same resist film. The height dimension of the first resist film 11 is smaller than the height dimension of the second resist film 12.

Figure 4A:
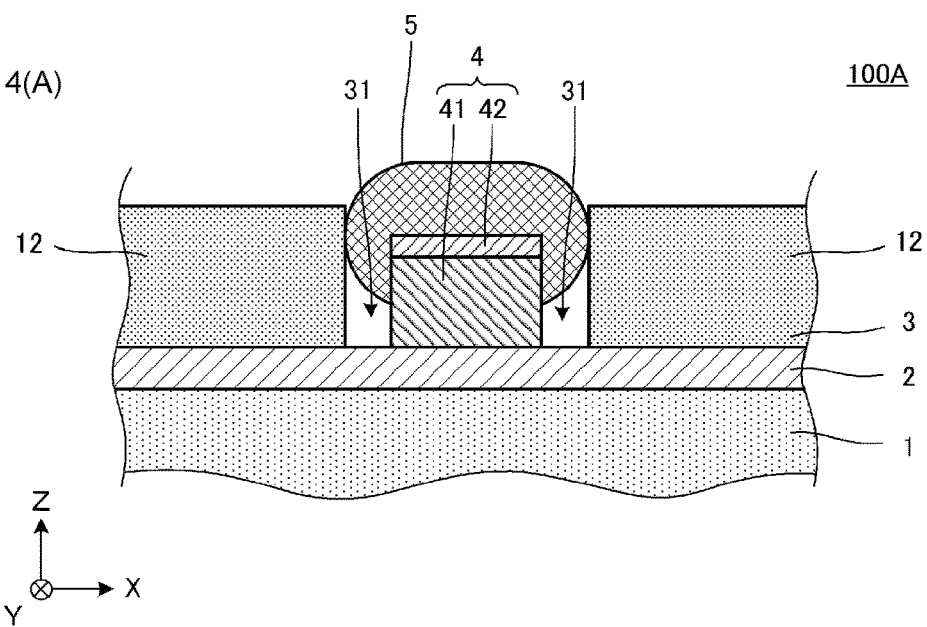
FIG. 4(A) is a detailed sectional view showing the configuration of an outer electrode 4 of a thin film element 100A that includes neither protective film nor first resist film, as a comparative example.

Next, advantages of disposition of the protective film 3 and the first resist film 11 will be described with reference to the drawings. FIG. 4(A) is a detailed sectional view showing the configuration of an outer electrode 4 of a thin film element 100A that includes neither a protective film nor a first resist film, as a comparative example, and FIG. 4(B) is a detailed sectional view showing the configuration of an outer electrode 4 of a thin film element 100B that includes no first resist film.

As shown in FIG. 4(A), a clearance 31 is located between the outer electrode 4 and the second resist film 12. Consequently, the conductive bonding material 5 may infiltrate along the outer electrode 4 into the clearance 31. Therefore, there is a concern that the wiring conductor film 2 exposed at the clearance 31 may come into contact and react (solder leaching or the like) with the conductive bonding material 5 so as to cause an increase in resistance value and breaking of wire in the wiring conductor film 2. In addition, there is a concern that moisture, flux, or the like may infiltrate into the clearance 31 and the wiring conductor film 2 exposed at the clearance 31 may be corroded.

Figure 4B:
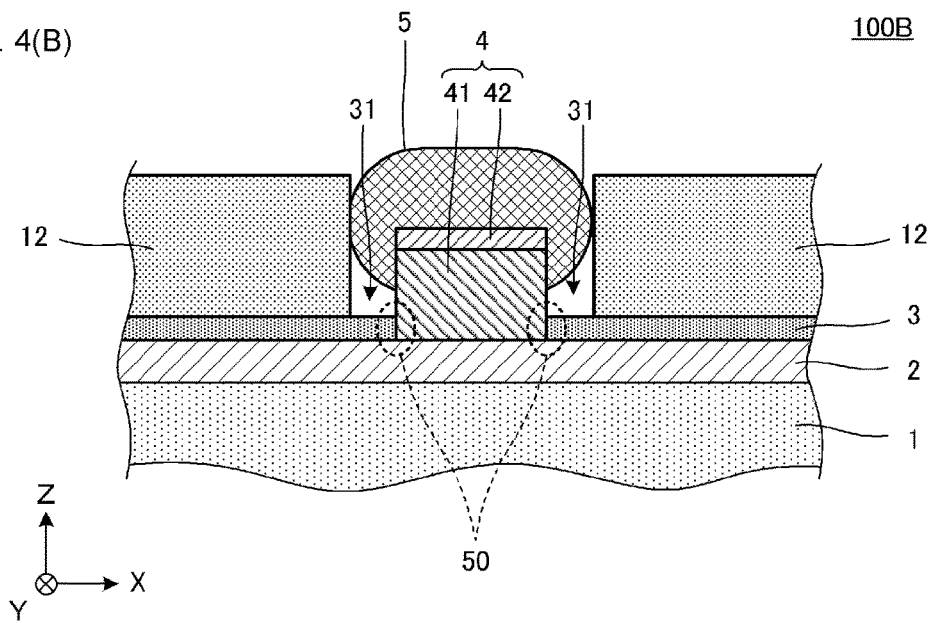
FIG. 4(B) is a detailed sectional view showing the configuration of an outer electrode 4 of a thin film element 100B that includes no first resist film.

Meanwhile, as shown in FIG. 4(B), when the surface of the wiring conductor film 2 is covered with the protective film 3, even if the conductive bonding material 5 infiltrates into the clearance 31, the reaction between the wiring conductor film 2 and the conductive bonding material 5 is suppressed because the wiring conductor film 2 is not exposed at the clearance 31. However, at the interface 50, the side surface of the outer electrode 4 and the protective film 3 are only physically adjacent to or in contact with each other and are not bonded to each other chemically. Consequently, there is a concern that moisture, flux, or the like may infiltrate into the interface 50, and the wiring conductor film 2 may react with the conductive bonding material 5 or the wiring conductor film 2 may be corroded.

On the other hand, in the present embodiment, the surface of the wiring conductor film 2 is covered with the protective film 3. In addition, in the present embodiment, the first resist film 11 is a loop-shaped thermosetting resin with which the surface of the protective film 3 is covered and is in contact with the entire circumference of the side surface S1 of the outer electrode 4. In this configuration, the wiring conductor film 2 is not exposed at the clearance 31. Therefore, even if a conductive bonding material 5, moisture, flux, or the like infiltrates into the clearance 31, a reaction or the like between the wiring conductor film 2 and the conductive bonding material 5 is suppressed. In addition, the thin film element 101 includes the first resist film 11 in contact with the entire circumference of the side surface S1 of the outer electrode 4 and, therefore, infiltration of a conductive bonding material, moisture, flux, or the like into the interface 50 between the side surface of the outer electrode 4 and the protective film 3 is suppressed.

Further, the first resist film 11 shrinks when being cured and, as a result, a stress occurs in the cured loop-shaped first resist film 11 so as to cause tightening inward (refer to open arrows in FIG. 1). Therefore, the side surface S1 of the outer electrode 4 is tightened by the first resist film 11, with which the surface of the protective film 3 is covered, and infiltration of a conductive bonding material, moisture, flux, or the like into the interface 50 between the side surface of the outer electrode 4 and the protective film 3 is further suppressed.

Meanwhile, in the present embodiment, the second resist film 12 is disposed at a distance from the first resist film 11, and a clearance 31 is located between the first resist film 11 and the second resist film. If the clearance 31 is not located, stress that directs outward from the interface to the outer electrode 4 occurs in the resist film. As a result, there is a concern that a gap may occur between the side surface of the outer electrode 4 and the resist film, and a conductive bonding material, moisture, flux, or the like may infiltrate into the gap. In the present embodiment, stress that directs outward from the outer electrode 4 occurs in the cured second resist film 12 (refer to solid arrows in FIG. 1). However, the occurrence of a gap between the outer electrode 4 and the resist film is further suppressed because the second resist film 12 is disposed at a distance from the first resist film 11.

In addition, the outer electrode 4 according to the present embodiment has an overhang portion 6 present along the entire circumference of the side surface S1, and the first resist film 11 overlaps the overhang portion 6 when viewed in Z-direction. According to this configuration, movement of the cured loop-shaped first resist film 11 in a direction from the bottom surface of the outer electrode 4 toward the top surface can be suppressed.

The above-described thin film element 101 is produced by, for example, the following steps. FIGS. 5(1) to 5(6) are sectional views sequentially showing production steps of the thin film element 101.

Initially, as shown in FIG. 5(1), a base material 1 in a state of a collective board is prepared, and about 1 μm of wiring conductor film 2 is formed on the surface of the base material 1 by ion sputtering or the like. The base material 1 is, for example, a Si substrate of a passive element, an LC composite electronic component, an integrated circuit element, an ESD protective element, or the like, and the wiring conductor film 2 is, for example, a metal film of Cu or the like. This step of forming the wiring conductor film 2 on the surface of the base material 1 corresponds to a "first step" as described herein.

Subsequently, about 0.1 μm of protective film 3 is formed continuously by ion sputtering or the like. The protective film 3 is, for example, a metal film containing Ti or the like as a primary component. Thereafter, about 5 μm of positive type photosensitive resist film is formed on the entire surface of the protective film 3 by spin coating and patterned by exposure. According to this step, a resist film 51 having a tapered shape in a direction from the bottom surface toward the top surface is formed. Further, etching is performed while the resist film 51 is used as a mask so as to form a contact hole CH1 at a location overlapping the wiring conductor film 2 in the protective film 3. According to this step, the wiring conductor film 2 is exposed at the contact hole CH1. This step of forming the protective film 3 on the wiring conductor film 2 and forming the contact hole CH1 at a location overlapping the wiring conductor film 2 in the protective film 3 corresponds to a "second step" as described herein.

Then, as shown in FIG. 5(2), the outer electrode 4 is formed on the surface of the wiring conductor film 2 exposed at the contact hole CH1. Specifically, about 3 μm of first electrode layer 41 and about 0.1 μm of second electrode layer 42 are formed continuously in the contact hole CH1 and on the surface of the wiring conductor film 2 by an electrolytic plating method. The first electrode layer 41 is, for example, a metal plating film containing Ni as a primary component, and the second electrode layer 42 is, for example, a metal plating film containing Au as a primary component.

The metal plating film of the outer electrode 4 grows along the resist film 51 having a tapered shape in a direction from the bottom surface toward the top surface. Consequently, the side surface of the outer electrode 4 is formed into a reverse tapered shape in a direction from the bottom surface toward the top surface while the overhang portion 6 along the entire circumference of the side surface is formed. This step of forming the outer electrode 4 that has the overhang portion 6 along the entire circumference of the side surface in the contact hole CH1 and on the surface of the wiring conductor film 2 corresponds to a "third step" as described herein.

Then, as shown in FIGS. 5(3) and 5(4), the resist film 51 is removed by asking and, thereafter, about 5 μm of resist film 10 is formed on the surfaces of the protective film 3 and the outer electrode 4 by spin coating. The resist film 10 is, for example, a positive type photosensitive solder resist film. In this regard, the resist film 51 may be removed by wet treatment using a peeling apparatus. This step of forming the resist film 10 on the surface of the protective film 3 corresponds to a "fourth step" as described herein.

Subsequently, as shown in FIG. 5(5) and FIG. 5(6), the clearance 31 that keeps a portion (first resist film 11) overlapping the overhang portion 6 in plan view, in the resist film 10, apart from a portion (second resist film 12) other than the above-described portion is removed by photolithography. Specifically, a portion that is not intended to be removed is covered with a photomask 61, and exposure is performed by light L1. At this time, the overhang portion 6 of the outer electrode 4 is used as a photomask, and a portion overlapping the overhang portion 6 in plan view is not exposed. Therefore, the clearance 31 that keeps the first resist film 11 apart from the second resist film 12 is removed by performing development and rinse. The light L1 is, for example, ultraviolet rays (UV light).

This step of removing clearance 31 that keeps first resist film 11, in the resist film 10, overlapping the overhang portion 6 in plan view apart from the second resist film 12 corresponds to a "fifth step" as described herein. In this regard, the fifth step includes the step of performing exposure while the overhang portion 6 of the outer electrode 4 is used as the photomask.

After the fifth step, the surface of the outer electrode 4 is precoated with the conductive bonding material 5. The conductive bonding material 5 is, for example, solder. In this regard, the conductive bonding material 5 may be formed by a reflow process after screen printing with a solder paste is performed. Alternatively, the conductive bonding material 5 may be formed by the reflow process after the surface of the outer electrode 4 is coated with flux or the like and a solder ball is mounted and temporarily fixed. Further, the conductive bonding material 5 may be in a state in which the surface of the outer electrode 4 is coated with flux or the like and a solder ball is mounted and temporarily fixed.

According to the above-described manufacturing method, the thin film element 101 including the outer electrode 4 with high reliability can be readily produced while solder leaching, corrosion, and the like of the wiring conductor film 2 are suppressed.

In addition, according to the above-described manufacturing method, the first resist film 11 in contact with the entire circumference of the side surface of the outer electrode 4 can be readily formed because the resist film 10 is a positive type photosensitive resist film and the overhang portion 6 of the outer electrode 4 is used as a photomask.

Second Embodiment

A second embodiment shows an example in which the shapes of the outer electrode 4 and the first resist film 11 are different from the shapes in the first embodiment.

Figure 6:
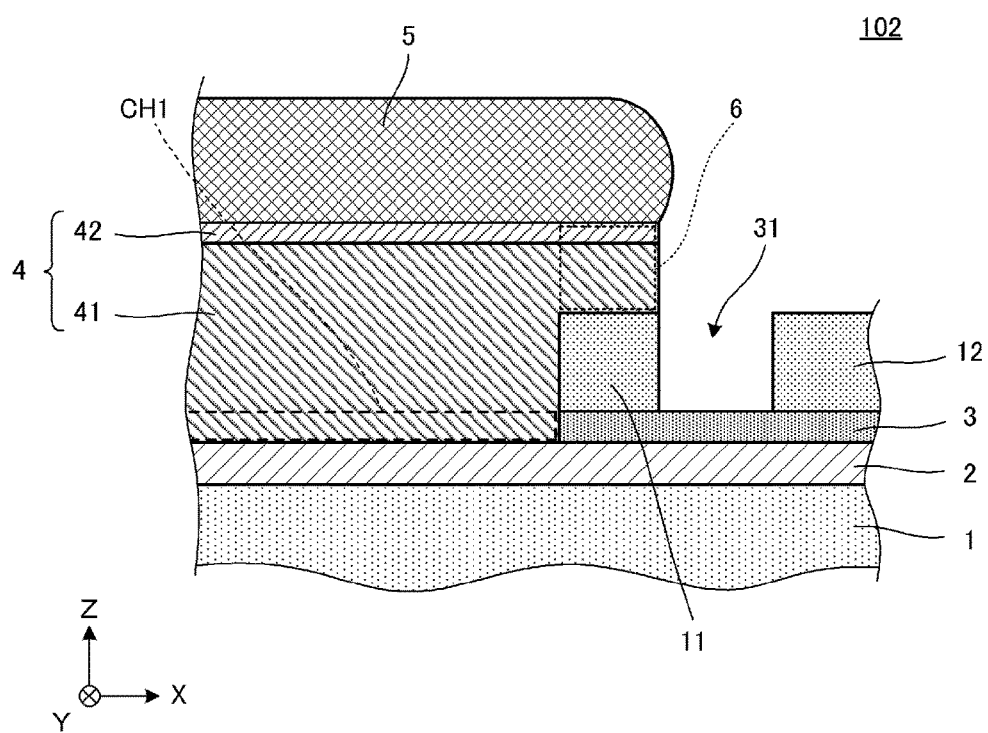
FIG. 6 is a detailed sectional view showing the configuration of an outer electrode 4 of a thin film element 102 according to a second embodiment.

FIG. 6 is a detailed sectional view showing the configuration of an outer electrode 4 of a thin film element 102 according to a second embodiment.

As shown in FIG. 6, the outer electrode 4 according to the present embodiment has a shape in which the upper portion of the side surface protrudes outwardly. Even when the structure is as described above, the outer electrode 4 has the overhang portion 6 present along the entire circumference of the side surface. Meanwhile, the first resist film 11 is in contact with the entire circumference of the side surface of the outer electrode 4 and the entire first resist film 11 falls within the overhang portion 6 of the outer electrode 4 when viewed in Z-direction.

Other Embodiments

In this regard, the above-described embodiment shows the example in which the shape of the outer electrode 4 is circular in plan view, but the shape is not limited to circular. The shape of the outer electrode 4 in plan view can be appropriately changed to square, rectangular, polygonal, elliptical, or the like.

In addition, the overhang portion 6 is not limited to a portion disposed as the upper portion of the side surface of the outer electrode 4. The overhang portion 6 has only to be a portion that spaced from the bottom surface (base) of the outer electrode 4 when viewed in Z-direction and disposed as a portion other than the bottom surface of the outer electrode 4. That is, the overhang portion 6 may be disposed at the central portion or the like of the side surface of the outer electrode 4.

Meanwhile, the wiring conductor film 2 is not limited to a film disposed on the entire surface of the base material 1 and may be disposed on part of the surface of the base material 1. In addition, the protective film 3 has to be disposed at least on the surface of the wiring conductor film 2 and may be also disposed on the surface of the base material 1.

In this regard, the above-described embodiment shows the example in which the surface of the base material 1 is a flat surface but the surface is not limited to a flat surface. The surface of the base material 1 may be a curved surface and the surface of the base material 1 may have a height difference.

REFERENCE SIGNS LIST

CH1 contact hole
L1 light
S1 side surface of outer electrode
1 base material
2 wiring conductor film
3 protective film
4 outer electrode
5 conductive bonding material
6 overhang portion
10 resist film
11 first resist film
12 second resist film
31 clearance
41 first electrode layer
42 second electrode layer
50 interface
51 resist film
61 photomask
100A, 100B, 101, 102 thin film element

The invention claimed is:

1. A film element comprising:
a base material;
a wiring conductor film on the base material;
a protective film that covers a surface of at least the wiring conductor film and that has a contact hole at a location overlapping the wiring conductor film in a plan view of the film element;
an outer electrode extending at least within the contact hole and onto the wiring conductor film, the outer electrode being thicker than the protective film and having a side surface with an overhang portion that extends along an entire circumference of the side surface and overhangs the protective film;
a first resist film in direct contact with the entire circumference of the side surface of the outer electrode at the overhang portion, in direct contact with the protective film, and overlapping the overhang portion in the plan view of the film element; and
a second resist film disposed at a distance from the side surface of the outer electrode and the first resist film and in direct contact with and covering a surface of the protective film.

2. The film element according to claim 1, wherein the first resist film is a thermosetting resin.

3. The film element according to claim 2, wherein the second resist film is a thermosetting resin.

4. The film element according to claim 2, wherein the side surface has a reverse tapered shape in a direction from a bottom surface toward a top surface of the outer electrode.

5. The film element according to claim 1, wherein the side surface has a reverse tapered shape in a direction from a bottom surface toward a top surface of the outer electrode.

6. The film element according to claim 1,
wherein the wiring conductor film is a first metal film containing copper as a primary component thereof,
the protective film is a second metal film containing titanium as a primary component thereof, and
the outer electrode is a third metal film containing nickel as a primary component thereof.

7. The film element according to claim 1, wherein the outer electrode includes a first electrode layer on the wiring conductor film, and a second electrode layer on the first electrode layer.

8. The film element according to claim 7, wherein the first electrode layer is a Ni plating film, and the second electrode layer is a Au plating film.

9. The film element according to claim 1, wherein a first height dimension of the first resist film is smaller than a second height dimension of the second resist film.

10. A method for manufacturing a film element, the method comprising:
forming a wiring conductor film on a surface of a base material;
covering a surface of at least the wiring conductor film with a protective film having a contact hole at a location overlapping the wiring conductor film;
forming an outer electrode at least in the contact hole and on the surface of the wiring conductor film such that the outer electrode has a side surface with an overhang portion extending along an entire circumference of the side surface and overhanging the protective film;
covering a surface of the protective film with a resist film such that the resist film is in direct contact with the protective film and the entire circumference of the side surface of the outer electrode; and
removing portions of the resist film so as to separate the resist film into a first resist film portion and a second resist film portion that are spaced apart from each other, the first resist film portion being in direct contact with the entire circumference of the side surface of the outer electrode and the protective film and overlapping the overhang portion in a plan view of the film element, and the second resist film portion in direct contact with the protective film.

11. The method for manufacturing a film element according to claim 10, wherein the portions of the resist film are removed by photolithography.

12. The method for manufacturing a film element according to claim 11, wherein the resist film is a positive type photosensitive resist film, and the overhang portion of the outer electrode is used as a photomask during the photolithography to form the first resist film portion.

13. The method for manufacturing a film element according to claim 10, further comprising precoating a surface of the outer electrode with solder after removing the portions of the resist film.

14. The method for manufacturing a film element according to claim 10, wherein the outer electrode is formed such that the side surface has a reverse tapered shape in a direction from a bottom surface toward a top surface of the outer electrode.

15. The method for manufacturing a film element according to claim 1, wherein the wiring conductor film is a first metal film containing copper as a primary component thereof,
the protective film is a second metal film containing titanium as a primary component thereof, and
the outer electrode is a third metal film containing nickel as a primary component thereof.

16. The method for manufacturing a film element according to claim 10, wherein the outer electrode includes a first electrode layer on the wiring conductor film, and a second electrode layer on the first electrode layer.

17. The method for manufacturing a film element according to claim 16, wherein the first electrode layer is a Ni plating film, and the second electrode layer is a Au plating film.

18. The method for manufacturing a film element according to claim 10, wherein the portions of the resist film are removed such that a first height dimension of the first resist film portion is smaller than a second height dimension of the second resist film portion.

* * * * *